(12) United States Patent
Adan

(10) Patent No.: US 6,737,711 B1
(45) Date of Patent: May 18, 2004

(54) SEMICONDUCTOR DEVICE WITH BIT LINES FORMED VIA DIFFUSION OVER WORD LINES

(75) Inventor: Alberto Oscar Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 336 days.

(21) Appl. No.: 09/466,845

(22) Filed: Dec. 20, 1999

(30) Foreign Application Priority Data

Dec. 22, 1998 (JP) .......................................... 10-364666

(51) Int. Cl.[7] .................... H01L 29/76; H01L 29/94; H01L 31/062; H01L 31/119
(52) U.S. Cl. ...................................... 257/391; 257/390
(58) Field of Search ................................ 257/390–391, 257/66, 347–351; 438/300–305, 160–165

(56) References Cited

U.S. PATENT DOCUMENTS

| | | | | |
|---|---|---|---|---|
| 5,231,296 A | * | 7/1993 | Rodder | 257/66 |
| 5,652,159 A | * | 7/1997 | Hirano | 438/160 |
| 5,721,169 A | | 2/1998 | Lee | |
| 5,780,350 A | * | 7/1998 | Kapoor | 438/305 |
| 5,828,113 A | | 10/1998 | Chen et al. | |
| 6,060,750 A | * | 5/2000 | Hisamoto et al. | 257/347 |

FOREIGN PATENT DOCUMENTS

| | | |
|---|---|---|
| JP | 2-044768 | 2/1990 |
| JP | 4-226071 | 8/1992 |
| JP | 6-013564 | 1/1994 |
| JP | 6-291284 | 10/1994 |
| JP | 8-008435 | 1/1996 |
| JP | 8-293612 | 11/1996 |
| JP | 10-275914 | 10/1998 |

OTHER PUBLICATIONS

Patent Abstract of Japan, vol. 007, No. 144 (E–183), Jun. 23, 1983 and JP 58–056456 A (Tokyo Shibaura Denki KK), Apr. 4, 1983.

* cited by examiner

Primary Examiner—Cuong Nguyen
(74) Attorney, Agent, or Firm—Nixon & Vanderhye P.C.

(57) ABSTRACT

A semiconductor device including an insulating film, a plurality of word lines parallel to one another, a gate insulating film and a first conductivity type semiconductor layer that are formed in this order, wherein the surface of said insulating film is rendered flat with respect to the surface of the word lines, and the first conductivity type semiconductor layer includes bit lines comprising a plurality of second conductivity type high concentration impurity diffusion layers crossing the word lines and parallel to one another.

6 Claims, 10 Drawing Sheets

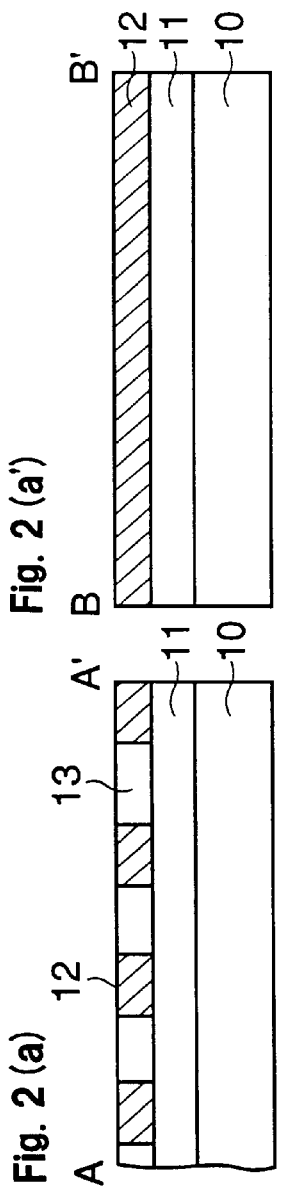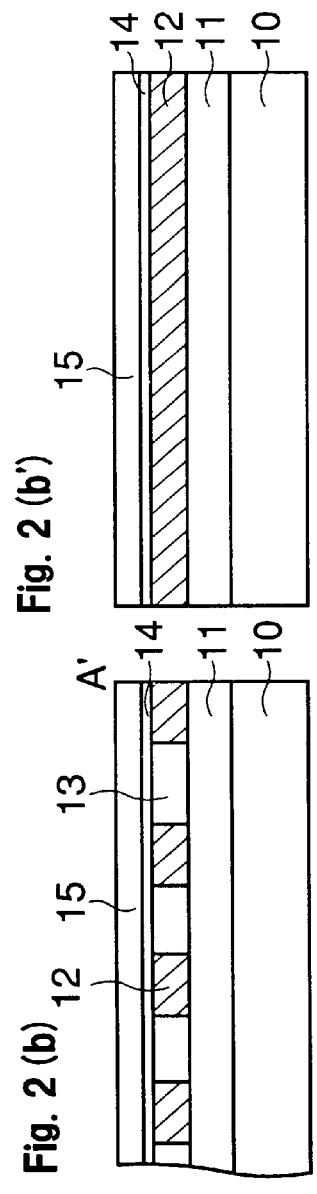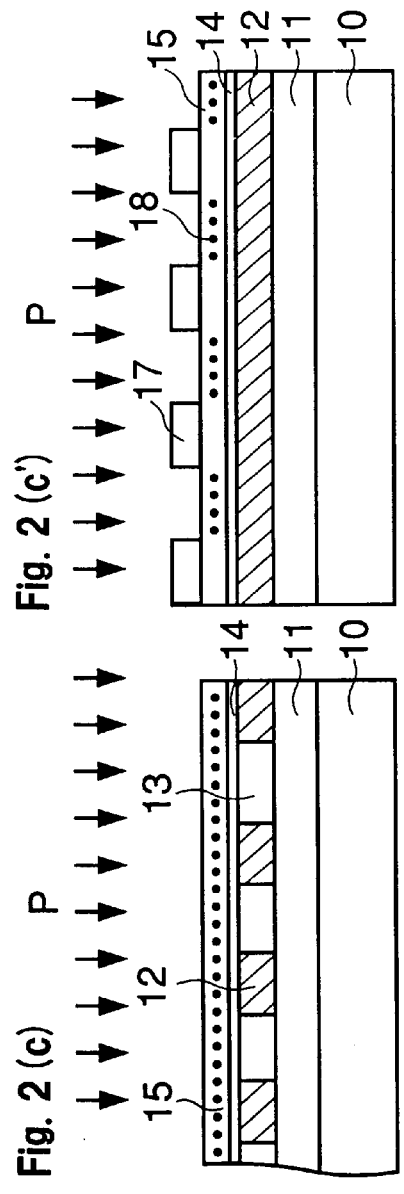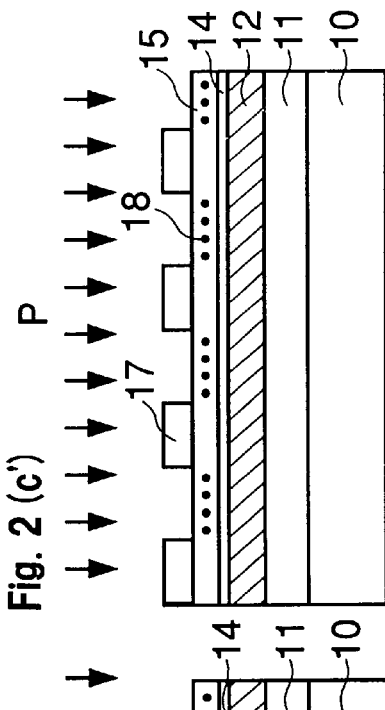

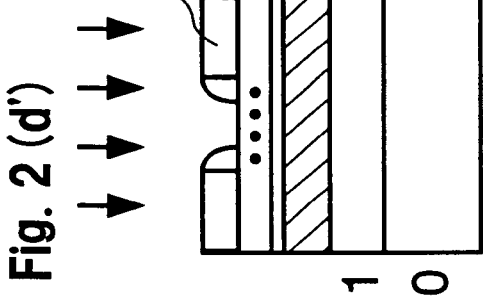
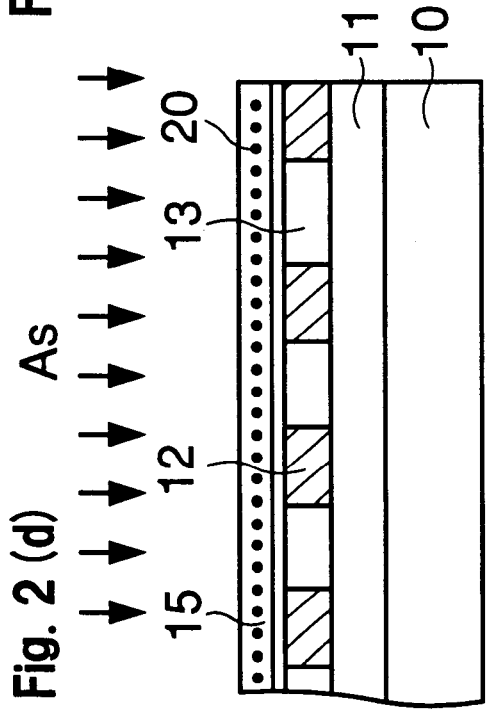
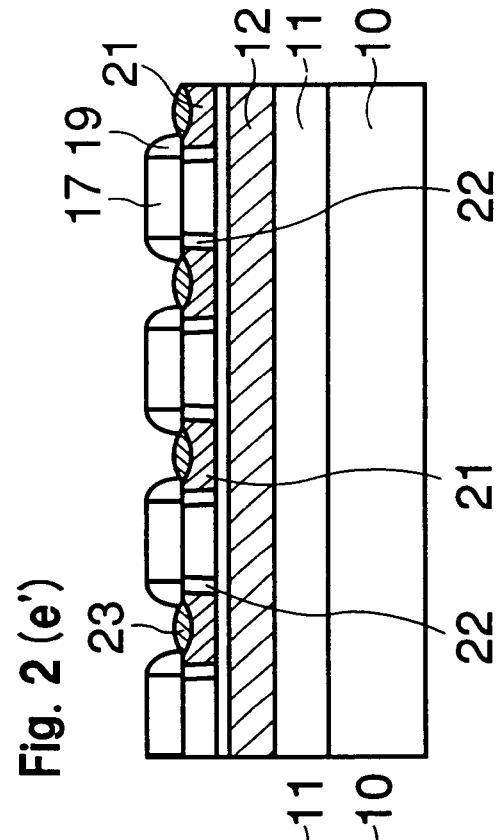

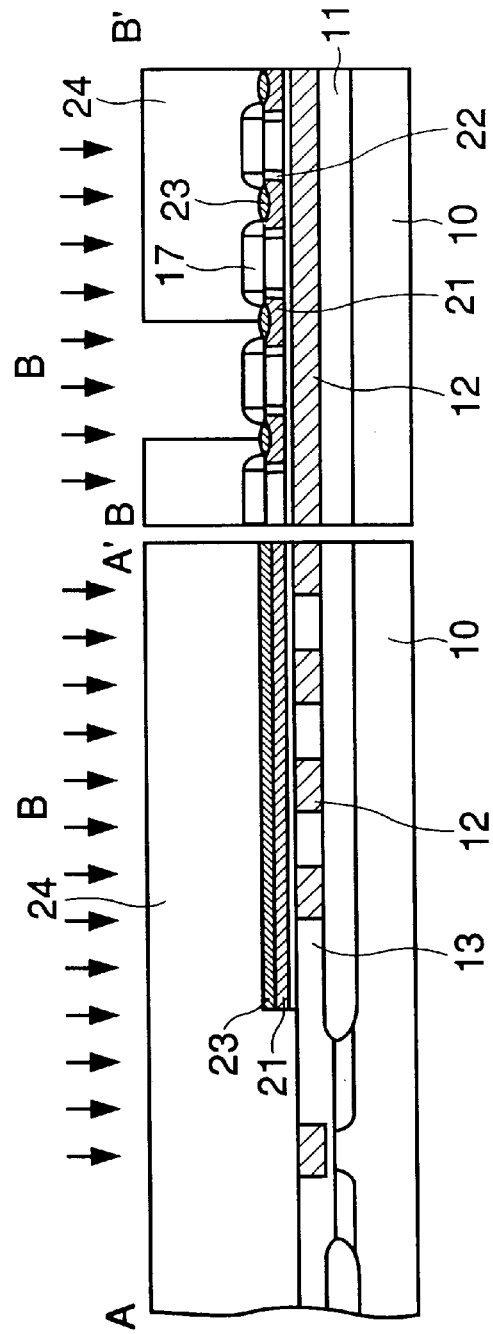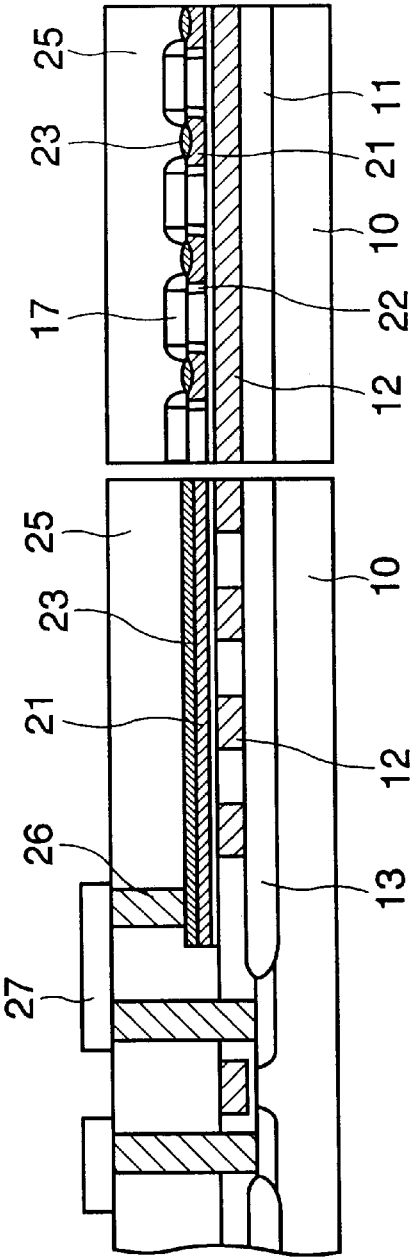

Fig. 10 (a) (Prior Art)
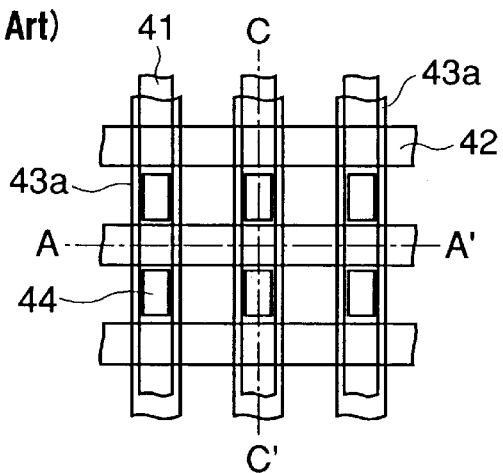
Fig. 10 (b) (Prior Art)
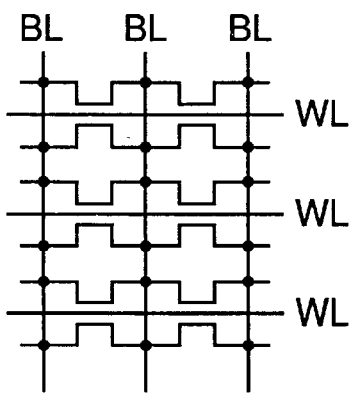
Fig. 10 (c) (Prior Art)
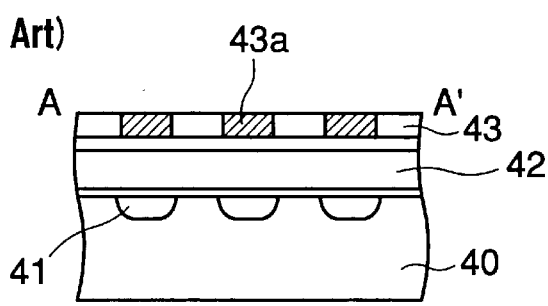
Fig. 10 (d) (Prior Art)
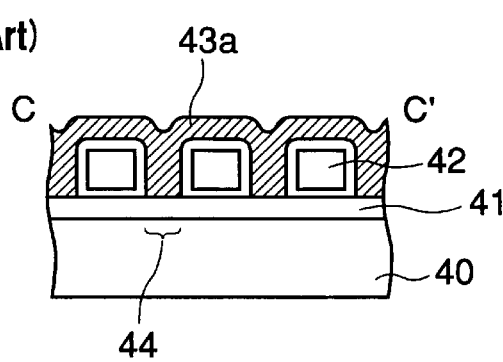

SEMICONDUCTOR DEVICE WITH BIT LINES FORMED VIA DIFFUSION OVER WORD LINES

BACKGROUND OF THE INVENTION

1. Field of the Invention

This invention relates to a semiconductor device and a production method thereof. More particularly, this invention relates to a semiconductor device having a novel ROM cell array structure and a production method thereof.

2. Description of the Related Art

A flat cell structure that is simple in construction and can be fabricated easily has been used in the past as a NOR type memory cell of a mask ROM (MROM), as shown in FIGS. 7 and 8. A unit memory cell of the MROM having such a flat cell structure is generally referred to as a "single drain type memory cell". The unit memory cell comprises a MOS transistor that in turn comprises two bit lines 31 formed of two diffusion layers containing a high concentration impurity and adjacent to each other, and a word line 32 formed of a poly-silicon film and crossing the bit lines 31.

Such a memory cell is programmed by a low threshold voltage (Vth=0.5 V, for example) or a high threshold voltage higher than a power source voltage (Vth=5V and power source voltage Vdd=3 V, for example). The memory cell is connected to selection transistors QBTOP and QBBOT and constitutes a NOR type ROM array as shown in an equivalent circuit diagram of FIG. 9.

Generally, sub-micron channel MOSFETs employ an LDD (Lightly Doped Drain) structure in order to cope with degradation resulting from a short channel effect and hot carriers.

However, it is not so easy to apply this LDD structure to the memory cell having the flat cell structure described above for the following reasons. The LDD structure is fabricated by the steps of forming a gate electrode, forming a low concentration impurity diffusion layer with this gate electrode as a mask, forming further a side wall spacer on the gate electrode, and then forming a high concentration impurity diffusion layer using these gate electrode and side wall spacer as masks. In the flat cell structure, on the other hand, a high concentration impurity diffusion layer to serve as bit lines and source/drain regions are first formed and word lines are then so formed as to cross the high concentration impurity diffusion layer. Therefore, the low concentration impurity diffusion layer cannot be formed in self-alignment between the high concentration impurity diffusion layer and a region that is to function later as the channel.

If the low concentration impurity diffusion layer is formed in self-alignment with the high concentration impurity diffusion layer, a series of the following process steps are necessary in addition to the ordinary fabrication steps of:

① forming an oxide film on the entire surface of a substrate and forming openings of those regions of this oxide film which are to function as the low concentration impurity diffusion layer and as the high concentration impurity diffusion layer;

② implanting impurities at a low dose by using the oxide film as a mask;

③ depositing further an oxide film on the oxide film having the openings, and etching back this oxide film to form a side wall spacer in the openings;

④ implanting impurities at a high dose using this oxide film and the side wall spacer as the mask; and ⑤ etching and removing the oxide film and the side wall spacer used as the mask.

As the size of transistors has further been reduced to the size in the sub-micron order, the size of the high concentration impurity diffusion layer is also reduced, and the resistance of the high concentration impurity diffusion layer increases with this scale-down. This increase of the resistance results in the decrease of a driving current of the transistor constituting the cell, and delays the access time to the MROM.

A salicide technology has been employed ordinarily as means for lowering the resistance of the high concentration impurity diffusion layers to function as bit lines. However, the salicide technology that uses the word line as the mask cannot be applied easily to the memory cell having the flat cell structure described above because the word line crosses the bit line and the thickness of an insulating film to be formed on the bit line is equal to the thickness of an insulating film to be formed in regions other than the bit line region and the word line region.

Japanese Patent Laid-Open No. HEI 6(1994)-291284 proposes, as a NOR type memory cell of another MROM, a high density MROM shown in FIGS. 10(a) to (d).

This MROM has the following construction. Gate electrodes 42 are formed on a bulk Si substrate 40 in which high concentration impurity diffusion layers 41 are formed as bit lines. A silicon layer 43 is formed on the gate electrodes 42, and high concentration impurity diffusion layers 43a are formed in the silicon layer 43. The upper and lower high concentration impurity diffusion layers 41 and 43a are connected to one another at contact portions 44, in consequence, a high integration density is achieved by using in common the gate electrodes 42. In other words, the high integration density is achieved by combining each MROM having the flat cell structure with each MROM having the inverted flat cell structure in such a manner as to share the gate electrode 42 between them.

Nonetheless, the MROM having this construction cannot cope with the short channel effect and lowering of the resistance of the high concentration impurity diffusion layer resulting from scale-down.

SUMMARY OF THE INVENTION

The present invention provides a semiconductor device comprising an insulating film, a plurality of word lines parallel to one another, a gate insulating film and a first conductivity type semiconductor layer that are formed in this order: wherein the surface of said insulating film is rendered flat with respect to the surface of said word lines, and said first conductivity type semiconductor layer includes bit lines comprising a plurality of second conductivity type high concentration impurity diffusion layers crossing said word lines and parallel to one another.

In another aspect, the present invention provides a method of producing a semiconductor device comprising the steps of: (a) forming an insulating film and word lines, and flattening the surface of said insulating film with respect to the surface of said word lines; (b) forming a gate insulating film and a first conductivity type semiconductor layer on said insulating film and said word lines; (c) forming a plurality of line-like insulating films parallel to one another and crossing said word lines, on said semiconductor layer; (d) implanting a second conductivity type impurity into said semiconductor layer with said line-like insulating film as a mask, and thereby forming a plurality of second conductivity type low concentration impurity diffusion layers; (e) forming an insulating side wall spacer on said line-like insulating film, and implanting a second conductivity type impurity into said semiconductor layer with said line-like insulating film and said side wall spacer as masks, and thereby forming a plurality of second conductivity type high concentration impurity diffusion layers; (f) forming a salicide film on the surface of said second conductivity type high concentration impurity diffusion layer with said line-like insulating film and said side wall spacer as masks; and (g) forming an inter-layer insulating film on said semiconductor layer inclusive of said line-like insulating film and said side wall spacer.

In still another aspect, the present invention provides a method of producing a semiconductor device which comprises an insulating film, a plurality of word lines parallel to one another, a gate insulating film and a first conductivity type semiconductor layer that are formed in this order: wherein the surface of said insulating film is rendered flat with respect to the surface of said word lines, and said first conductivity type semiconductor layer includes bit lines comprising a plurality of second conductivity type high concentration impurity diffusion layers crossing said word lines and parallel to one another comprising the steps of: (a) forming an insulating film and word lines, and flattening the surface of said insulating film with respect to the surface of said word lines; (b) forming a gate insulating film and a first conductivity type semiconductor layer on said insulating film and said word lines; (c) forming a plurality of line-like insulating films parallel to one another and crossing said word lines, on said semiconductor layer; (d) implanting a second conductivity type impurity into said semiconductor layer with said line-like insulating film as a mask, and thereby forming a plurality of second conductivity type high concentration impurity diffusion layers.

BRIEF DESCRIPTION OF THE DRAWINGS

FIGS. 2(a) to 2(g) and 2(a') to 2(g') are schematic sectional views of the principal portions taken along lines A–A' and B–B' of the ROM cell shown in FIG. 1 and useful for explaining a production method of the ROM cell array having the inverted flat cell structure of FIG. 1;

FIG. 10 is (a) a schematic plan view, (b) an equivalent circuit diagram, (c) a sectional view taken along a line A–A' and (d) a sectional view taken along a line C–C' of the principal portions of a cell array according to the prior art.

DESCRIPTION OF THE PREFERRED EMBODIMENTS

Figure 1:
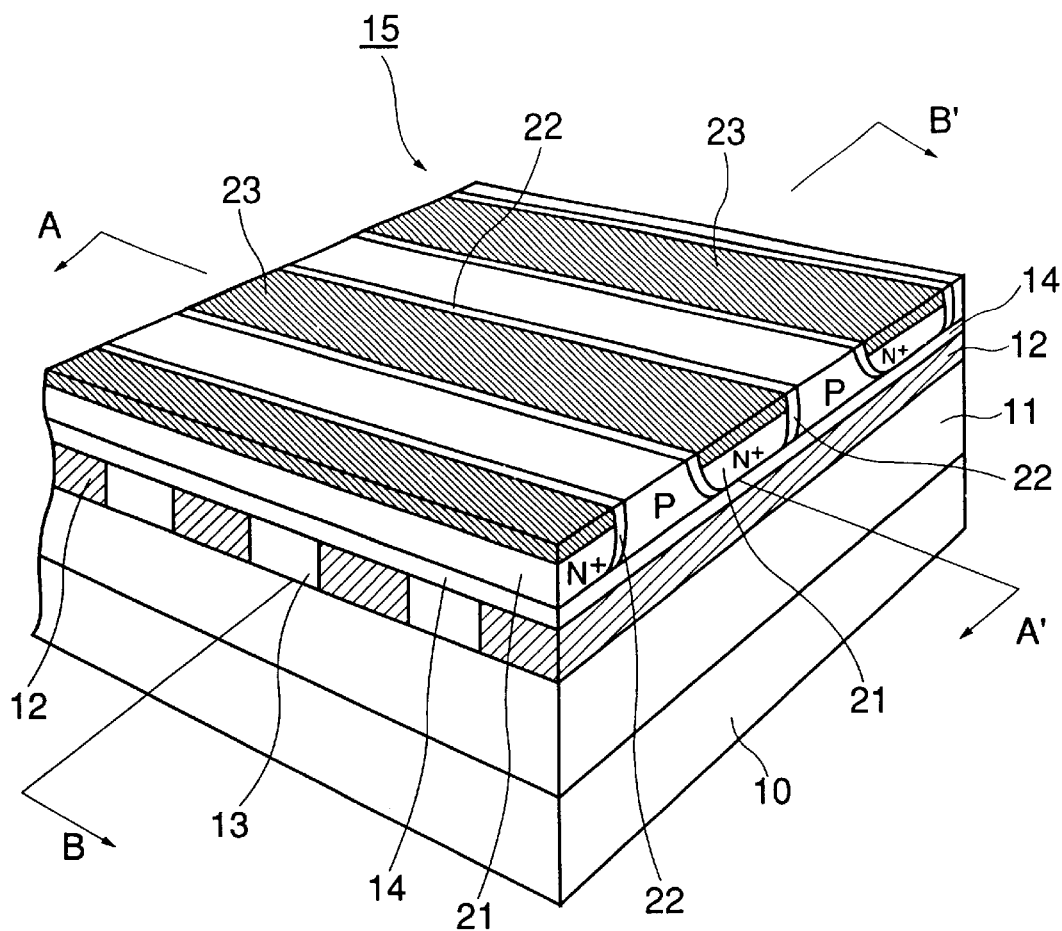
FIG. 1 is a schematic perspective view showing principal portions of a ROM cell array having an inverted flat cell structure as a semiconductor device according to an embodiment of the present invention.

A semiconductor device according to the present invention is a semiconductor device having an inverted flat cell structure in which an insulating film, a plurality of word lines that are parallel to one another, a gate insulating film and a semiconductor layer of a first conductivity type, are mainly laminated in this order.

The semiconductor device of the present invention is fabricated preferably on a semiconductor substrate. In this case, various substrates can be used for the semiconductor substrate. For example, a semiconductor substrate of silicon or germanium, or a substrate of a compound semiconductor such as GaAs or InGaAs can be employed. Incidentally, circuit devices such as transistors, capacitors and resistors, or circuits such as RAM, ROM and peripheral circuits, may be formed on the semiconductor substrate.

The insulating film is preferably formed on the semiconductor substrate as described already. It may be formed, for example, immediately on the semiconductor substrate, or may be formed as an inter-layer insulating film on devices and circuits, or as a device isolation film such as a LOCOS film. This insulating film can be formed into a suitable film thickness in accordance with the functions required for the inter-layer insulating film, the device isolation film, and so forth. For example, the film thickness is from about 300 to about 500 nm. The insulating film may be formed further as a single-layered film or laminate film of a $SiO_2$ film or/and a SiN film.

Word lines that will be later described are formed on the insulating film. A part of the insulating film is interposed between the word lines, and its surface is made flat with respect to the surface of the word lines. In other words, the insulating film may have trenches on the surface thereof so that when the word lines are buried into its surface, their surfaces have the same level. The insulating film may comprise upper and lower layers whose surfaces are flattened through a series of process steps of forming first the lower insulating film as a single-layered film or a laminate film, forming the word lines on the lower layer insulating film, laminating then the upper layer insulating film for burying the gaps between the word lines, and flattening the surface to the upper insulating film and exposing the surface of the word lines by etching-back.

A plurality of word lines that are parallel to one another are formed on the insulating film. The word lines can be fabricated by using a material that functions as the word line of the ordinary semiconductor devices, into a film thickness and a width required for the word line. Examples of the material include metals such as aluminum, copper, silver, platinum and high melting point metals (e.g. tungsten, tantalum, titanium, molybdenum, etc), poly-silicon, and silicides and polycides with the high melting point metals. Particularly preferred among them are molybdenum silicide and titanium nitride because they can withstand a high temperature process and have a low conductivity. The film thickness may range from about 150 to about 300 nm, and the wide is from about 0.1 to about 0.5 μm, for example.

A gate insulating film is formed on the flattered insulating film and word lines is rendered flat with that of the insulating film. The gate insulating film can be formed using a material, and into a film thickness, that generally function as the gate insulating film of transistors. Examples are a single-layered film or a laminate film of the $SiO_2$ film or/and the SiN film. The film thickness is from about 5 to about 10 nm, for example.

A first conductivity type semiconductor layer is formed on the gate insulating film. This semiconductor layer is the one that functions as an active layer for forming a transistor. It can be composed of a thin film layer of a semiconductor such as silicon or germanium, or a compound semiconductor such as GaAs or InGaAs. Particularly preferred is the silicon layer. For, the silicon layer has a low defect density and a small grain boundary. The film thickness of the semiconductor layer can be adjusted appropriately in consideration of performance of the resulting semiconductor device. For example, it is from about 30 to about 150 nm.

A first conductivity type semiconductor layer is doped first conductivity type impurities into the semiconductor layer. Examples of the first conductivity type impurity are phosphorus and arsenic in the case of a N type and are boron in the case of an P type. The impurity concentration is not particularly limited so long as it is the concentration of the impurity that is generally contained in the semiconductor substrate or in the semiconductor layer constituting the transistor. For example, it is from about $5\times10^{16}$ to $3\times10^{17}$ $cm^{-3}$. The first conductivity type impurity may be doped uniformly into the semiconductor layer, or may be doped in a low or high concentration into a region, in which the channel region of the transistor is to be later formed, or into a part of such a region.

A plurality of second conductivity type high concentration impurity diffusion layers that cross the word lines and are parallel to one another are formed on the first conductivity type semiconductor layer. The second conductivity type high concentration impurity diffusion layer contains boron in the case of the P type and phosphorus or arsenic in the case of the N type. The impurity concentration is generally equivalent to the concentration of the impurity diffusion layer that functions as the bit lines or the source/drain region, for example, from about $1\times10^{20}$ to from about $1\times10^{21}$ $cm^{-3}$. The width is from about 0.1 to about 0.5 $\mu m$. Incidentally, the second conductivity type high concentration diffusion layer preferably has a depth substantially equal to the thickness of the semiconductor layer.

A second conductivity type low concentration impurity diffusion layer may be formed in the portions of this first conductivity type semiconductor layer that exist between, and adjacent to, the second conductivity type high concentration impurity regions. Incidentally, the second conductivity type low concentration impurity diffusion layer is formed preferably in the adjacent regions on both sides of the high concentration impurity diffusion layer. The second conductivity type low concentration diffusion layer preferably has a depth smaller than that of the second conductivity type high concentration diffusion layer, and is preferably formed into a width of from about 0.05 to about 0.15 $\mu m$, for example. It functions as a so-called "LDD" region. Its impurity concentration is from about $1\times10^{18}$ to $1\times10^{19}$ $cm^{-3}$, for example.

A salicide film is preferably formed on the surface of the second conductivity type high concentration impurity diffusion layer formed on the semiconductor substrate. When the semiconductor layer comprises the silicon layer, the salicide layer is, for example, a $TiSi_2$ film. The film thickness of the salicide film is preferably from about 20 to about 50 nm as a final thickness.

In the semiconductor device according to the present invention having the construction described above, a plurality of cell transistors are formed at the points of intersection between two mutually adjacent second conductivity high concentration impurity diffusion layers and one word line crossing them, and constitute a mask ROM cell array. In this case, each cell transistor uses the two second conductivity type high concentration impurity diffusion layers as its source/drain regions, the first conductivity type semiconductor layer between these second conductivity type high concentration impurity diffusion layer as its channel region and one word line as its gate electrode.

In this mask ROM cell array comprising a plurality of cell transistors, the write operation can be executed by setting the first conductivity type impurity concentration of the channel region of a desired transistor to a higher or lower concentration than the concentration of the first conductivity type semiconductor layer, and thus changing the threshold voltage of the transistor. For example, the logic "1" or "0" of the transistor in the mask ROM cell array can be expressed by regulating the threshold voltage to a low threshold voltage (for example, 0.4 V) or to a high threshold voltage (for example, 5 V with the power source voltage being 3 V), respectively.

The present invention can provide a semiconductor device having a higher integration density by stacking a plurality of inverted flat cell structures each comprising the laminate of the insulating film, the word line, the gate insulating film and the first conductivity type semiconductor layer as described above. In this case, a line-like insulating film, that is formed on only the channel region in the first conductivity type semiconductor device of the lower layer semiconductor device, and an insulating side wall spacer, that is formed optionally on a second conductivity type low concentration impurity diffusion layer, may be interposed between the first conductivity type semiconductor layer of the lower layer semiconductor device and the insulating film of the upper layer semiconductor device. Furthermore, other inter-layer insulating films, devices, circuits, and so forth, or their combination, may be likewise interposed.

The semiconductor device according to the present invention can be fabricated by the following method.

(a) First, the insulating film and the word line are formed preferably on the semiconductor substrate, and the surface of the insulating film is flattened to the surface of the word lines. Flattening in this case may be effected by a series of process steps of forming the insulating film, forming then a plurality of trenches parallel to one another so that the word lines can be buried into them, laminating a conductor material for constituting the word lines on the insulating film having the trenches, and etching back the conductor film until the surface of the insulating film is exposed. Alternatively, flattening can be effected by forming the insulating film, laminating the conductive material, patterning the conductive material in such a manner as to form the word lines, laminating again the insulating film, and etching back this insulating film until the surface of the word lines is exposed.

(b) Next, the gate insulating film and the first conductivity type semiconductor layer are formed over these insulating film and word lines. The gate insulating film can be formed by a known method such as CVD method. The first conductivity type semiconductor layer can be formed by CVD method using a silane gas, for example, by implanting the first conductivity type impurities by ion implantation after the semiconductor layer is formed, and crystallizing the semiconductor layer. It is further possible to form the semiconductor layer while the first conductivity type impurity is being doped and then to crystallize the semiconductor layer. Gettering may be carried out after crystallization. Crystallization in this instance can be conducted by the solid phase crystal growth, a laser re-crystallization process or the method described in Japanese Patent Laid-Open No. HEI 9(1997)-312404, for example.

(c) A plurality of line-like insulating films that cross the word lines and are parallel to one another are then formed on the semiconductor layer. In this case, the line-like insulating film may comprise a singe-layered film or a laminate film of a $SiO_2$ film or/and a SiN film to a film thickness of from about 100 to about 300 nm. The shape of the line-like insulating film is such that it covers only the region which is to serve as the channel region of the transistor in a post-process step.

(d) A plurality of second conductivity type low concentration diffusion layers are formed by implanting the second conductivity type impurity into the semiconductor layer with the line-like insulation film as the mask. In this case, the impurity must be injected at acceleration energy such that the impurity does not penetrate through the line-like insulating film but can be injected into only the surface of the semiconductor layer. Acceleration energy at this time can be appropriately regulated in accordance with the film thickness of the semiconductor layer, the depth of the second conductivity type low concentration impurity diffusion layer, and so forth, and is from about 40 to about 70 keV, for example.

(e) The side wall spacer is formed on the line-like insulating film. The second conductivity type impurity is then injected into the semiconductor layer with these line-like insulating film and insulating side wall spacer as the mask, forming a plurality of second conductivity type high concentration impurity diffusion layers in the semiconductor layer. The impurity must be injected at this time at acceleration energy such that the impurity does not penetrate through the line-like insulating film and through the side wall spacer but reaches the bottom of the semiconductor layer through activation. Acceleration at this time can be regulated appropriately in accordance with the film thickness of the semiconductor layer, the depth of the second conductivity type low concentration impurity diffusion layer, and so forth, and is from about 50 to about 80 keV, for example.

(f) The salicide film is formed on the surface of the second conductivity type high concentration impurity diffusion layers with the line-like insulating film and the side wall spacer as the mask. The salicide film is formed in the following way. First, a high melting point metal film having, for example, a film thickness of about 20 to about 50 nm is deposited on the entire surface of the semiconductor substrate inclusive of the line-like insulating film and the side wall spacer. Heat-treatment is then carried out in a nitrogen atmosphere at a temperature within the range of 600 to 650° C. for 10 to 20 minutes, for example, thereby converting the high melting point metal film, that keeps contact with the semiconductor layer, to a silicide film. The high melting point metal film that is not converted to the silicide film is etched and removed. Heat-treatment is further carried out at a temperature within the range of about 800 to 850° C. to form a low resistance film.

(g) The inter-layer insulating film is then formed on the semiconductor layer inclusive of the line-like insulating film and the side wall spacer. In other words, the line-like insulating film and the side wall spacer, that are used as the mask in the preceding step, are used as a part of the inter-layer insulating film without being removed. The inter-layer insulating film is generally an insulating film that is formed between devices and the wiring layer in order to form the wiring layer on the devices such as transistors. Therefore, its film thickness is not particularly limited so long as the insulation of these members can be secured. The material of the inter-layer insulating film is not particularly limited, either, so long as the insulation can be normally secured. It may be either a single-layered film or a laminate film.

In order to write the data into the semiconductor device according to the present invention, the write operation is preferably conducted by implanting impurity ions into the channel region of the transistor at such a level of acceleration energy that the impurity ions penetrate through the line-like insulating film, under the state where the line-like insulating film and the side wall spacer are formed before the inter-level insulating film is formed in the step (g) described above. The dose of the impurity ions at this time can be regulated appropriately so that the concentration can set the transistor to a desired threshold value.

Hereinafter, a semiconductor device according to the present invention and a production method thereof will be explained with reference to the accompanying drawings.
Embodiment 1:

The semiconductor device according to the present invention is the MROM having the inverted flat cell structure as shown in FIG. 1.

In this MROM, a silicon substrate 10 and an insulating film 11 are laminated in this order. A plurality of word lines 12 is formed in parallel with one another on this insulating film 11. An insulating film 13 consisting of a CVD oxide film is interposed between each pair of adjacent word lines 12. The insulating film 13 isolates the word lines 12 from one another, and flattens the surface of the word lines 12. A silicon layer 15 that is to serve as an active layer is disposed over the word lines 12 and the insulating film 13 through an gate through an insulating film 14. A plurality of high concentration impurity diffusion layers 21 that is to function as bit lines and source/drain regions is formed in this silicon layer in such a fashion as to cross the word lines 12. Low concentration impurity diffusion layers 22 are formed in self-alignment with the high concentration impurity diffusion layers 21. A low resistance $TiSi_2$ film 23 is formed on the surface of the high concentration impurity diffusion layers 21 in the silicon layer 15. A CVD insulating film 17 (not shown in the drawing) is formed in regions of the silicon layer 15 other than the high concentration impurity diffusion layers 21 and the low concentration impurity diffusion layer 22. A side wall spacer 19 (not shown) is formed on the side wall of the CVD insulating film 17, and an inter-layer insulating film 25 (not shown) is further formed on them.

Next, a method of producing the MROM having the inverted flat cell structure shown in FIG. 1 will be explained.

First, as shown in FIGS. 2(a) and 2(a'), the insulating film 11 comprising silicon oxide having a film thickness of from about 300 to about 500 nm is formed on the silicon substrate 10 made of bulk silicon on which desired devices (not shown) are formed. Incidentally, this insulating film 11 is formed as a LOCOS film in the case of the CMOS process. This insulating film 11 preferably has a large thickness in order to reduce a parasitic capacitance between the word lines, that are to be later formed, and the silicon substrate 10.

A high melting point metal film such as $MoSi_2$ or TiN is formed on the insulating film 11 to a film thickness of from about 150 to about 300 nm. This film is then patterned into a desired shape by photolithography and etching to form the word lines 12. The insulating film 13 is then deposited on the word lines 12 and is flattened by CMP method. If any level difference or a step exists in the underlying layer in the crystallization process of the silicon layer to be deposited in a subsequent step, the film thickness of the silicon layer as well as crystallization become non-uniform due to the level difference, and crystallization cannot be effected in a desired way. Incidentally, it is also possible to form trenches for forming the word lines 12 in the insulating film 13 and to then form the word lines 12 inside the trenches.

Next, as shown in FIGS. 2(*b*) and 2(*b'*), the gate insulating film 14 having a film thickness of from about 5 to about 10 nm is formed by thermal oxidation or CVD method on the word lines 12. The silicon layer 15 to serve as an active layer is formed on the gate insulating film 14. This silicon layer 15 determines the characteristics of the transistor that constitutes the ROM memory cell. In order to obtain a high quality silicon layer 15, amorphous silicon is first deposited and then a solid phase crystal growth or laser re-crystallization is conducted. Thereafter, boron ions are implanted into the silicon layer 15 to be an impurity concentration of $5 \times 10^{16}$ to $3 \times 10^{17}$ cm$^{-3}$, forming the P-type silicon layer 15. Incidentally, the final film thickness of the silicon layer is about 50 nm.

Subsequently, as shown in FIGS. 2(*c*) and 2(*c'*), the CVD oxide film 17 is formed to a film thickness of 50 nm, and openings are bored in the CVD oxide film 17 of the regions in which the bit lines are to be formed by photolithography and etching in a subsequent step. Phosphorus 18 is implanted in a dose of about $2 \times 10^{13}$ ions/cm$^2$ at acceleration energy of about 20 keV with this CVD oxide film 17 as the mask.

Next, as shown in FIGS. 2(*d*) and 2(*d'*), a CVD oxide film or a nitride film is formed to a film thickness of about 200 nm on the entire upper surface of the CVD oxide film 17, and is then etched back, forming the side wall spacer 19 on the CVD oxide film 17. Arsenic 20 is ion-implanted in a dose of about $3 \times 10^{15}$ ions/cm$^2$ at implantation energy of about 40 keV with these CVD oxide film 17 and side wall spacer 19 as the mask.

Thereafter, the atoms so implanted are activated by RTA as shown in FIGS. 2(*e*) and 2(*e'*) to thereby form the high concentration impurity diffusion layers 21 that are to serve as the bit lines and the source/drain regions, and to form the low concentration impurity diffusions layers 22 in self-alignment with the high concentration impurity diffusion layers 21.

Subsequently, a titanium film is deposited to a film thickness of about 50 nm by sputtering on the resulting silicon substrate 10 with the CVD oxide film 17 and the side wall spacer 19 as the mask. Annealing is conducted in a N$_2$ atmosphere at about 600 to about 650° C. In this way, the titanium film is converted to a TiSi$_x$ film 23*a* in the regions where the silicon layer 15 keeps contact with the titanium film. Incidentally, the titanium film on the CVD oxide film 17 and the side wall spacer 19 turns to TiN. Next, Ti unreacted with TiN is removed by etching. Annealing is conducted at 800 to 850° C. so that the TiSi$_x$ film can be converted to a low resistance TiSi$_2$ film 23. In this way, low resistance of the bit lines can be achieved.

After the process steps described above, the formation of the LDD structure and the salicide film can be completed. As a result, the transistor the source/drain region of which has the LDD structure comprising the high concentration impurity diffusion layer 21 and the low concentration impurity diffusion layer 22 formed on the silicon layer 15, the channel region of which is interposed between these source/drain regions and which includes the gate insulating film 14 and the word line 12, can be fabricated.

Thereafter, a resist mask 24 having openings on the channel regions of desired transistors is formed as shown in FIGS. 2(*f*) and 2(*f'*). Boron is then ion-implanted in a dose of $1 \times 10^{14}$ ions/cm$^{-2}$ and implantation energy of 20 KeV through the CVD oxide film 17. The data write operation is then executed. In other words, the data "1" is written by setting the threshold voltage of the transistor to about 6 V, which is higher than the power source voltage, by this ion implantation, and the data "0" is written by setting the threshold voltage of the transistors, into which ion implantation is not made, to about 0.5 V. Incidentally, FIGS. 2(*f*) and 2(F') shows also the desired devices formed beforehand on the silicon substrate 10 such as the MOS transistors in the peripheral circuit.

Next, an inter-layer insulating film 25 is formed over the resulting silicon substrate 10 as shown in FIGS. 2(*g*) and 2(*g'*), and contact holes are opened. After contact plugs 26 and wiring layers 27 are formed, the inverted flat cell structure MROM can be completed. Incidentally, the CVD oxide film 17 used as the mask for ion-implanting the ions and for forming the salicide film need not be removed by etching in this inverted flat cell structure MROM.

Figure 3:
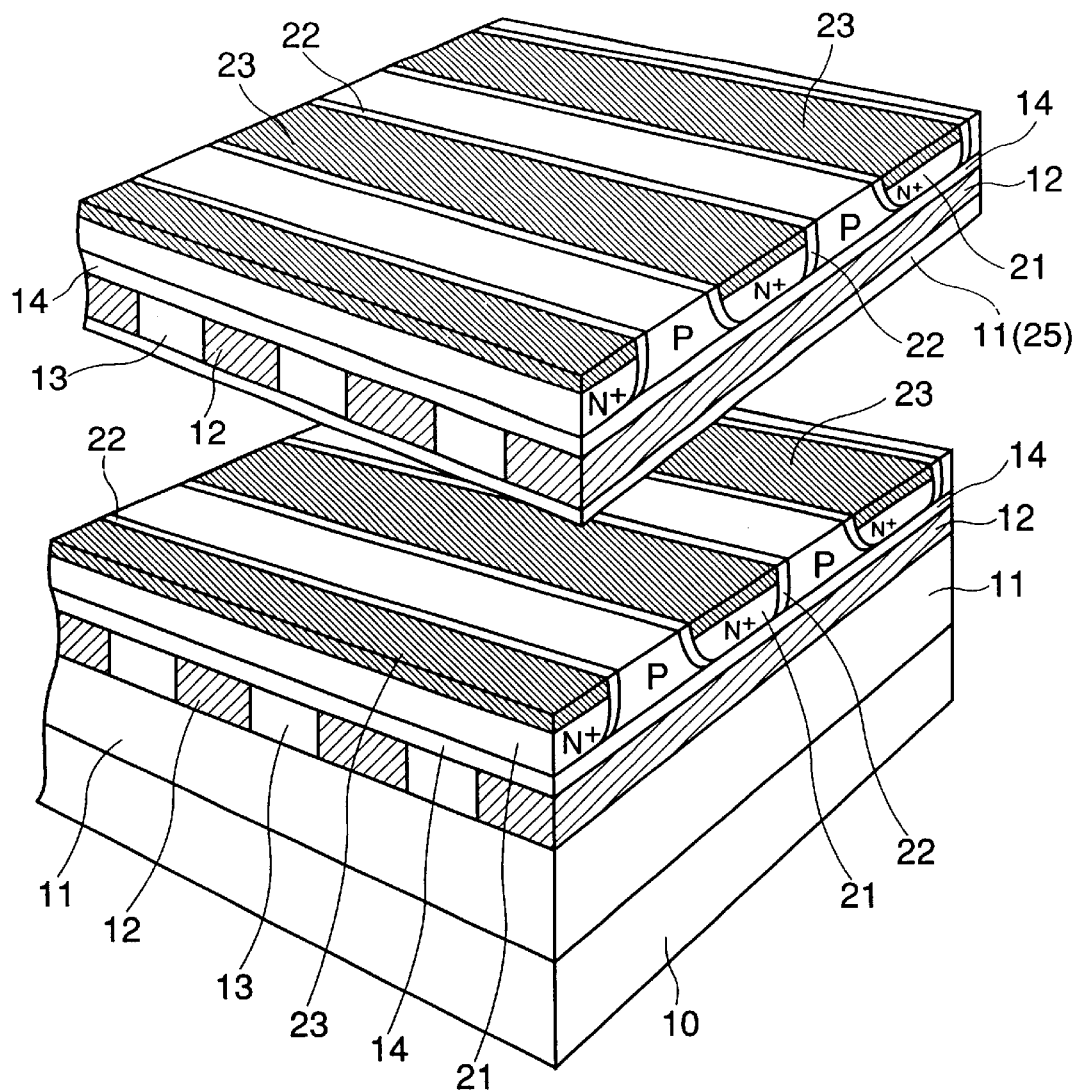
FIG. 3 is a schematic perspective view showing principal portions of a laminate structure of the ROM cell array having the inverted flat cell structure of FIG. 1 according to another embodiment of the present invention.

Embodiment 2:

A high density inverted flat cell structure MROM can be fabricated by repeatedly laminating the inverted flat cell structure MROMs fabricated in Embodiment 1, as shown in FIG. 3.

Figure 4:
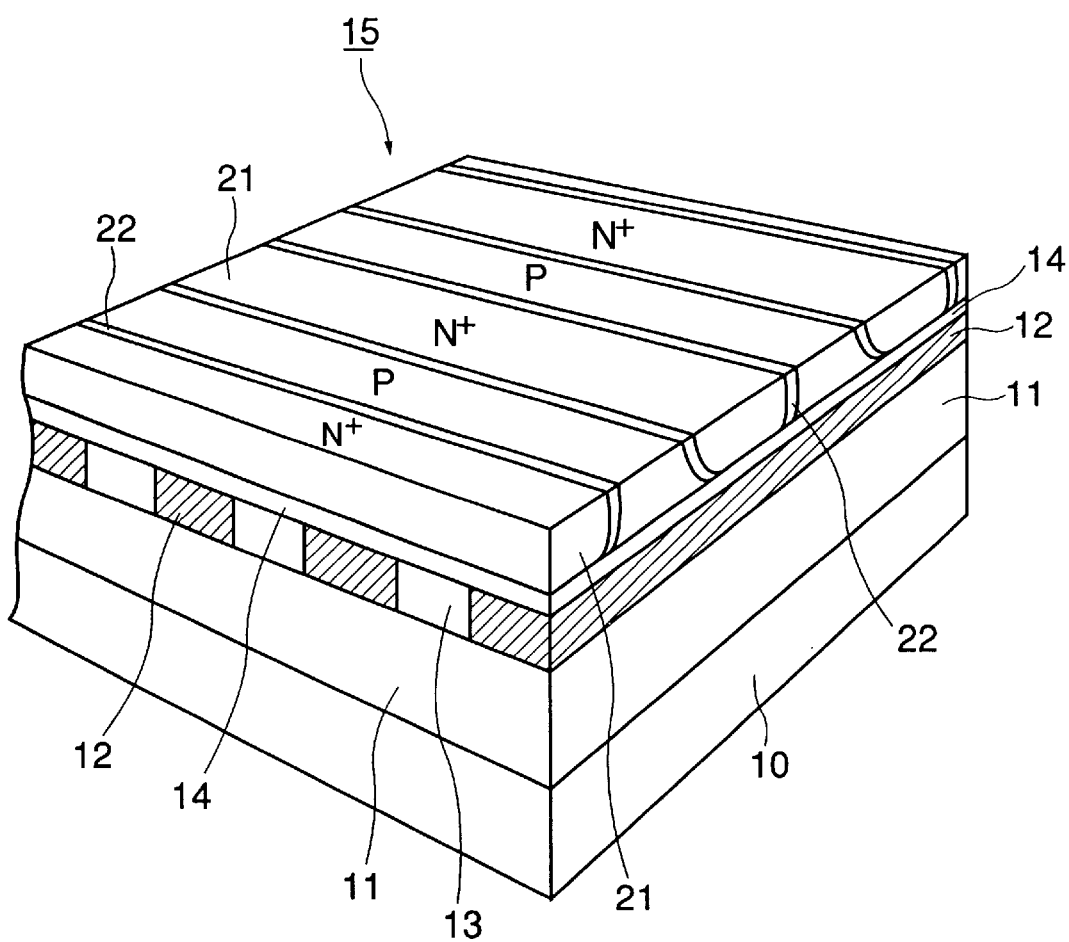
FIG. 4 is a schematic perspective view showing principal portions of a ROM cell array having an inverted flat cell structure as a semiconductor device according to another embodiment of the present invention.

Embodiment 3:

The semiconductor device of this embodiment is substantially the same as the inverted flat cell structure MROM of the embodiment 1 shown in FIG. 1 with the exception that the low resistance TiSi$_2$ film 23 is not formed on the surface of the high concentration impurity diffusion layer 21 as shown in FIG. 4.

Figure 5:
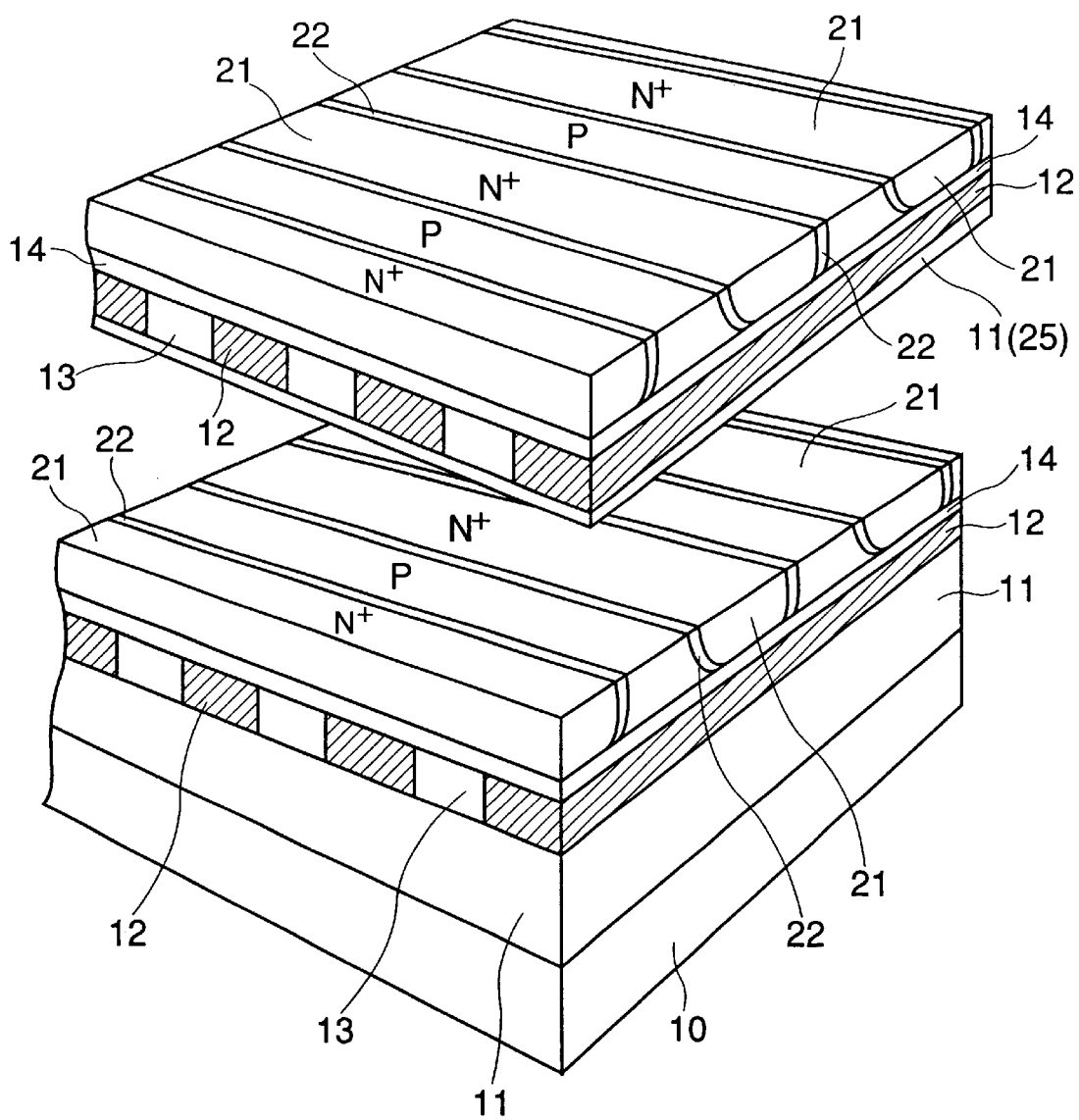
FIG. 5 is a schematic perspective view showing principal portions of a laminate structure of the ROM cell array having the inverted flat cell structure of FIG. 5 according to another embodiment of the present invention.

Embodiment 4:

The semiconductor device of this embodiment is substantially the same as the inverted flat cell structure MROM of the embodiment 2 shown in FIG. 4 with the exception that the low resistance TiSi$_2$ film 23 is not formed on the surface of the high concentration impurity diffusion layer 21, as shown in FIG. 5.

Figure 6:
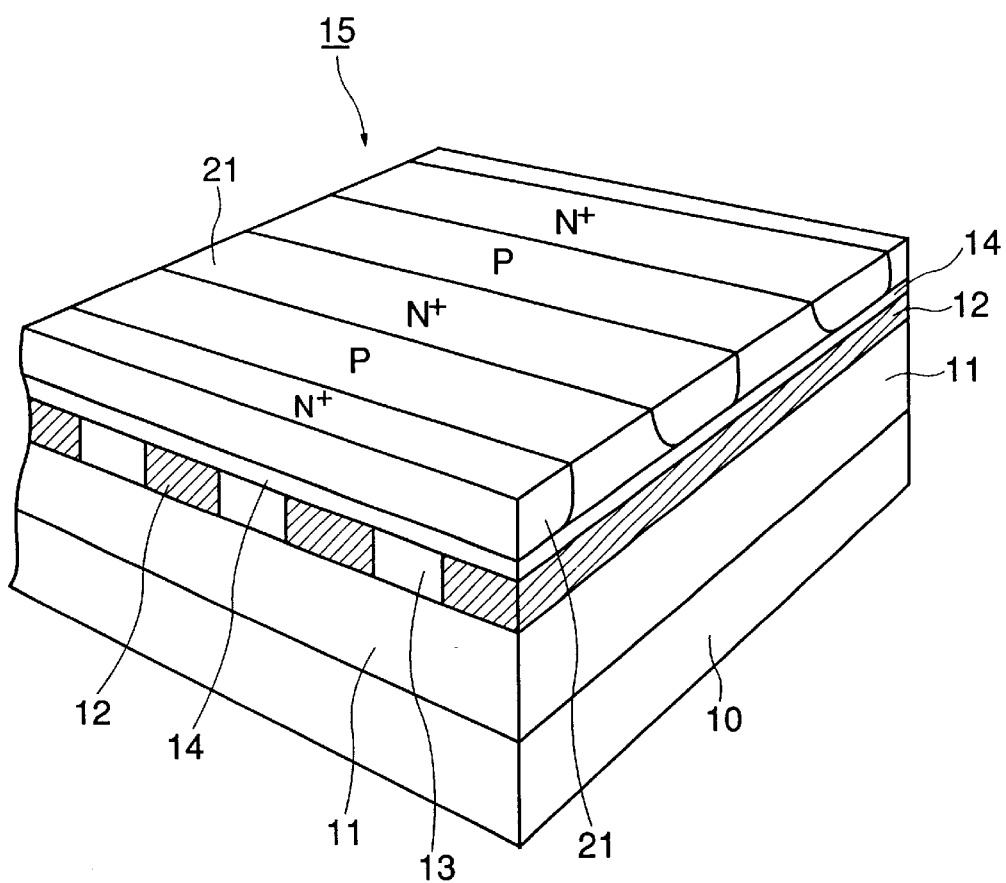
FIG. 6 is a schematic perspective view showing principal portions of a ROM cell array having an inverted flat cell structure as a semiconductor device according to still another embodiment of the present invention.
Figure 7:
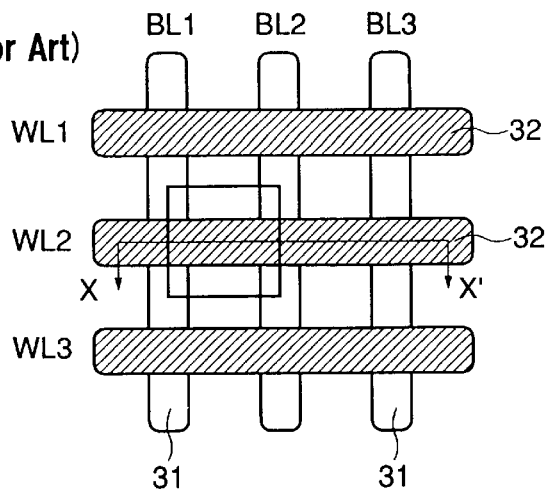
FIG. 7 is a schematic plan view showing principal portions of a cell array of a ROM according to the prior art.
Figure 8:
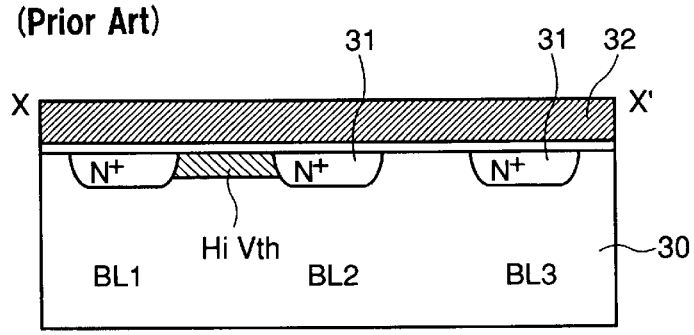
FIG. 8 is a sectional view taken along a line X–X' of the cell array shown in FIG. 7.
Figure 9:
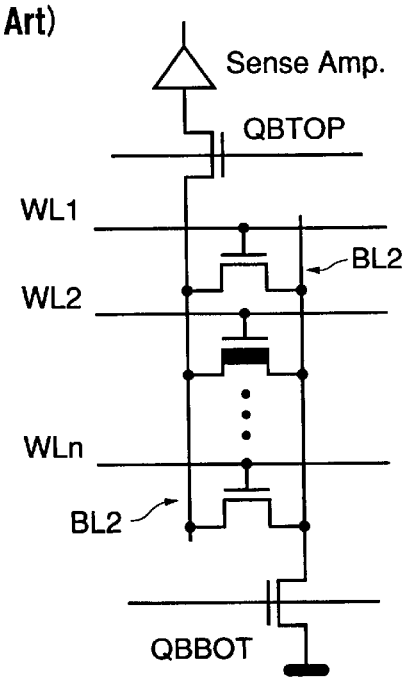
FIG. 9 is an equivalent circuit diagram of a NOR type ROM containing the cell array shown in FIG. 7.

Embodiment 5:

The semiconductor device of this embodiment is substantially the same as the inverted flat cell structure MROM of the embodiment 1 shown in FIG. 1 with the exception that the low concentration impurity diffusion layer 22 and the low resistance TiSi$_2$ film 23 on the surface of the high concentration impurity diffusion layer 21 are not formed, as shown in FIG. 6.

Embodiment 6:

This embodiment can form a high-density inverted flat cell structure MROM by repeatedly laminating the inverted flat cell structure MROMs fabricated in the embodiment 5.

The semiconductor device according to the present invention has the following construction. The insulating film, the mutually parallel word lines, the gate insulating film and the first conductivity type semiconductor layer are serially formed. The insulating film has the surface thereof flattened with respect to the surface of the word lines. The bit lines comprising a plurality of second conductivity type high concentration impurity diffusion layers, that cross the word lines and are parallel to one another, are formed on the first conductivity type semiconductor layer. Therefore, the first conductivity type semiconductor layer functioning as the active layer can be formed on the flat word line, and a high quality semiconductor layer can be obtained. Eventually, a semiconductor device having high reliability can be accomplished.

According to the construction of the semiconductor device, the source/drain regions having a so-called "LDD structure" can be fabricated by forming the second conductivity low concentration impurity diffusion layers in regions adjacent to the second conductivity type high concentration impurity diffusion layers functioning as the bit lines and as the source/drain regions. Therefore, the short-channel effect and degradation due to the hot carrier, that become remarkable with miniaturization of the transistor in the single drain structure, can be prevented. Furthermore, the source-drain withstand voltage in the single drain structure can be improved, and a higher power source voltage and the reduction of the access time can be achieved.

Because the salicide film can be formed easily on the surface of the second conductivity type high concentration impurity diffusion layer formed on the first conductivity semiconductor layer, the resistance of the bit line can be lowered and eventually, the driving capacity of the semiconductor device can be improved.

Moreover, because the semiconductor device is accomplished by the flat laminate structure, a plurality of such laminate structures can be easily laminated. Consequently, a semiconductor device having a higher density can be provided.

According to the fabrication method of the semiconductor device of the present invention, the line-like insulating film used for forming the impurity diffusion layer can be as such used as the inter-layer insulating film. Therefore, the semiconductor device having high reliability and high performance can be fabricated by a simple fabrication process.

I claim:

1. A semiconductor device comprising:

an insulating film, a plurality of word lines parallel to one another, a gate insulating film and a first conductivity type semiconductor layer that are formed in this order;

wherein the surface of said insulating film is rendered flat with respect to the surface of said word lines, and said first conductivity type semiconductor layer includes parallel bit lines each comprising a second conductivity type high concentration impurity diffusion layer crossing said word lines, and wherein on at least one of the bit lines a salicide film is formed on and in contact with the surface of said second conductivity type high concentration impurity diffusion layer.

2. A semiconductor device according to claim 1, wherein second conductivity type low concentration impurity diffusion layers are formed in regions adjacent to, and between, said second conductivity type high concentration impurity diffusion layers formed on said first conductivity type semiconductor layer.

3. A semiconductor device according to claim 1 comprising:

a plurality of cell transistors each formed in a region of where one of said word lines intersects two second conductivity type high concentration impurity diffusion layers adjacent to each other, said cell transistor using said two second conductivity type high concentration impurity regions as source/drain regions thereof, said first conductivity type semiconductor layer between said second conductivity type high concentration impurity diffusion layers as a channel region thereof, and said one word line as a gate electrode thereof; and wherein at least one of said channel regions of said cell transistors is set to a higher first conductivity type impurity concentration than said first conductivity type semiconductor region.

4. A semiconductor device comprising a laminate structure of a plurality of said semiconductor devices according claim 1.

5. A semiconductor device comprising:

an insulating film, a plurality of word lines parallel to one another, a gate insulating film and a first conductivity type semiconductor layer that are formed in this order;

wherein the surface of said insulating film is rendered flat with respect to the surface of said word lines, and said first conductivity type semiconductor layer includes parallel bit lines each comprising: (i) a second conductivity type high concentration impurity diffusion layer crossing said word lines, and (ii) second conductivity type low concentration impurity diffusion layers formed in regions adjacent to, and between, said second conductivity type high concentration impurity diffusion layer; and wherein in at least one of the bit lines a salicide film is formed on and in contact with the surface of said second conductivity type high concentration impurity diffusion layer but not on the surface of said adjacent low concentration impurity diffusion layers.

6. A semiconductor device comprising:

an insulating film, a plurality of word lines parallel to one another, a gate insulating film and a first conductivity type semiconductor layer that are formed in this order;

wherein the surface of said insulating film is rendered flat with respect to the surface of said word lines, and said first conductivity type semiconductor layer includes parallel bit lines each comprising a second conductivity type high concentration impurity diffusion layer crossing said word lines, and wherein in at least one of the bit lines a salicide film is formed on and in contact with the surface of said second conductivity type high concentration impurity diffusion layer but not on the surface of adjacent low concentration impurity diffusion layers.

* * * * *